US009311840B2

(12) United States Patent
Su et al.

(10) Patent No.: US 9,311,840 B2
(45) **Date of Patent: *Apr. 12, 2016**

(54) DISPLAY AND OPERATING METHOD THEREOF

(75) Inventors: Hsin-Chia Su, Tainan (TW); Chuan-Che Lee, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 10 days.

This patent is subject to a terminal disclaimer.

(21) Appl. No.: 13/609,782

(22) Filed: Sep. 11, 2012

(65) Prior Publication Data

US 2013/0050302 A1 Feb. 28, 2013

Related U.S. Application Data

(63) Continuation-in-part of application No. 13/219,264, filed on Aug. 26, 2011.

(51) Int. Cl.
*G06F 13/12* (2006.01)
*H03B 1/00* (2006.01)
(Continued)

(52) U.S. Cl.
CPC ................ *G09G 3/20* (2013.01); *G09G 3/2092* (2013.01); *G09G 3/3685* (2013.01); *G09G 2310/0275* (2013.01); *G09G 2370/10* (2013.01)

(58) Field of Classification Search
CPC ........................................................ G09G 3/36
USPC .................................................... 345/99, 100
See application file for complete search history.

(56) References Cited

U.S. PATENT DOCUMENTS

| | | | | |
|---|---|---|---|---|
| 5,703,629 A * | 12/1997 | Mermelstein | G06F 3/147 | 345/211 |
| 7,487,273 B2 * | 2/2009 | Kobayashi | G06F 3/14 | 345/100 |

(Continued)

FOREIGN PATENT DOCUMENTS

| | | |
|---|---|---|
| TW | 525023 | 3/2003 |
| TW | 200632821 | 9/2006 |

(Continued)

OTHER PUBLICATIONS

"Office Action of Taiwan Counterpart Application", issued on Dec. 2, 2013, p. 1-p. 19.

(Continued)

*Primary Examiner* — Temesgh Ghebretinsae
*Assistant Examiner* — Paras D Karki
(74) *Attorney, Agent, or Firm* — J. C. Patents

(57) ABSTRACT

A display and an operating method of the display are provided. The display includes a display panel, a timing controller, and a plurality of source drivers. The source drivers are coupled to the timing controller and the display panel, and the source drivers are coupled to one another. The timing controller outputs a plurality of training packets to the source drivers. When the source drivers lock a clock of the timing controller according to the training packets, the timing controller outputs a plurality of color data packets and a plurality of control packets to the source drivers according to a lock signal. The source drivers respectively output pixel voltages to the display panel and determine output timings of the pixel voltages according to the clock of the timing controller and the control packets. The training packets and the color data packets are serially transmitted to the source drivers.

12 Claims, 7 Drawing Sheets

(51) Int. Cl.

| | |
|---|---|
| ***G09G 5/10*** | (2006.01) |
| ***G09G 3/20*** | (2006.01) |
| ***G09G 3/36*** | (2006.01) |

(56) References Cited

U.S. PATENT DOCUMENTS

2008/0158424 A1* 7/2008 Park ........................ G09G 3/20 348/571
2008/0238844 A1* 10/2008 Kakiuchi ............. G09G 3/3611 345/87
2010/0148829 A1* 6/2010 Hong ................... G09G 3/3648 327/108
2013/0050298 A1* 2/2013 Su ........................ G09G 3/3611 345/691

FOREIGN PATENT DOCUMENTS

| | | |
|---|---|---|
| TW | 200632844 | 9/2006 |
| TW | 201117591 | 5/2011 |
| TW | 201312521 | 3/2013 |

OTHER PUBLICATIONS

"Office Action of Taiwan Counterpart Application", issued on May 26, 2014, p. 1-p. 17.

* cited by examiner

DISPLAY AND OPERATING METHOD THEREOF

CROSS-REFERENCE TO RELATED APPLICATION

This application is a continuation-in-part application of and claims the priority benefit of a prior application Ser. No. 13/219,264, filed on Aug. 26, 2011, now pending. The entirety of each of the above-mentioned patent application is hereby incorporated by reference herein and made a part of this specification.

BACKGROUND OF THE INVENTION

1. Field of the Invention

The invention relates to a display. More particularly, the invention relates to a display in which a timing controller serially transmits data and an operating method of the display.

2. Background of the Invention

A flat display apparatus, e.g., a thin film transistor liquid crystal display (TFT-LCD), has replaced the conventional cathode ray tube (CRT) display apparatus. Compared to the conventional CRT display, the TFT-LCD display is characterized by various advantages, such as low operating voltage, low power consumption, small volume, small thickness, light weight, etc.

In general, a timing controller and source drivers in a display transmit a control code and color data in parallel. The parallel data transmission contributes to reduction of transmission time, while the number of pins for outputting and receiving signals is increased. Therefore, a printed circuit board (PCB) that is equipped with both the timing controller and the source drivers has a great number of wires, and the circuit of the PCB is complicated. Since the number of pins in the timing controller and the source drivers may not be decreased, the chip area may not be reduced, and thus the hardware costs of the timing controller and the source drivers may not be lowered down.

SUMMARY OF THE INVENTION

The invention is directed to a display and an operating method thereof. The display has a timing controller and source drivers that are synchronously operated in no need of clock signals and latch signals. Thereby, the hardware costs of the timing controller and the source drivers may be lowered down.

In an embodiment of the invention, a display that includes a display panel, a timing controller, and a plurality of source drivers is provided. The source drivers are coupled to the timing controller and the display panel, and the source drivers are coupled to one another. The timing controller outputs a plurality of training packets to the source drivers. When the source drivers lock a clock of the timing controller according to the training packets, a lock signal is output to the timing controller. The timing controller outputs a plurality of color data packets and a plurality of control packets to the source drivers according to the lock signal. The source drivers respectively output a plurality of pixel voltages corresponding to the color data packets to the display panel and determine output timings of the pixel voltages according to the clock of the timing controller and the control packets. The training packets and the color data packets are serially transmitted to the source drivers.

According to an embodiment of the invention, each of the control packets includes two start bits, two end bits, and a control code that is located between the start bits and the end bits.

According to an embodiment of the invention, the training packets, the color data packets, and the control packets are respectively transmitted by a differential signal.

According to an embodiment of the invention, each of the color data packets includes two start bits, two end bits, and a color data code that is located between the start bits and the end bits.

According to an embodiment of the invention, the color data code corresponds to two of red color data, green color data, and blue color data.

According to an embodiment of the invention, the color data code corresponds to one of red color data, green color data, and blue color data.

According to an embodiment of the invention, the start bits respectively correspond to a logic high level, and the end bits respectively correspond to a logic low level.

According to an embodiment of the invention, each of the training packets includes two start bits, two end bits, a first clock code, and a second clock code. The first clock code is located between the start bits and the second clock code, and the second clock code is located between the first clock code and the end bits.

According to an embodiment of the invention, the start bits and a plurality of bits of the first clock code respectively correspond to a logic high level, and the end bits and a plurality of bits of the second clock code respectively correspond to a logic low level.

In an embodiment of the invention, an operating method of a display is provided. The display includes a display panel, a timing controller, and a plurality of source drivers. The operating method of the display includes following steps. The timing controller outputs a plurality of training packets to the source drivers. When the source drivers lock a clock of the timing controller according to the training packets, a lock signal is output to the timing controller. The timing controller outputs a plurality of color data packets and a plurality of control packets to the source drivers according to the lock signal. The source drivers respectively output a plurality of pixel voltages corresponding to the color data packets, and output timings of the pixel voltages are determined according to the clock of the timing controller and the control packets. The training packets and the color data packets are serially transmitted to the source drivers.

According to an embodiment of the invention, the source drivers sequentially lock the clock of the timing controller. When the $i^{th}$ source driver locks the clock of the timing controller, the $i^{th}$ source driver outputs a clock lock signal to the $(i+1)^{th}$ source driver, so as to trigger the $(i+1)^{th}$ source driver to lock the clock of the timing controller. When the last source driver locks the clock of the timing controller, the last source driver outputs the lock signal to the timing controller, and the first source driver of the source drivers is triggered by a system voltage to lock the clock of the timing controller. Here, i is greater than or equal to 1 and smaller than the number of the source drivers.

According to an embodiment of the invention, the source drivers lock the clock of the timing controller according to phase comparison.

As provided above, in the display and the operating method thereof described in the embodiments of the invention, operations of the timing controller and the source drivers may be synchronized due to the training packets, and the timings at which the source drivers output the pixel voltages are configured through the control packets. Hence, the timing controller and the source drivers are synchronously operated in no need of the clock signals and the latch signals, and the hardware costs of the timing controller and the source drivers may be lowered down.

Other features and advantages of the invention will be further understood from the further technological features disclosed by the embodiments of the invention wherein there are shown and described embodiments of this invention, simply by way of illustration of modes best suited to carry out the invention.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF EMBODIMENTS

Figure 1:
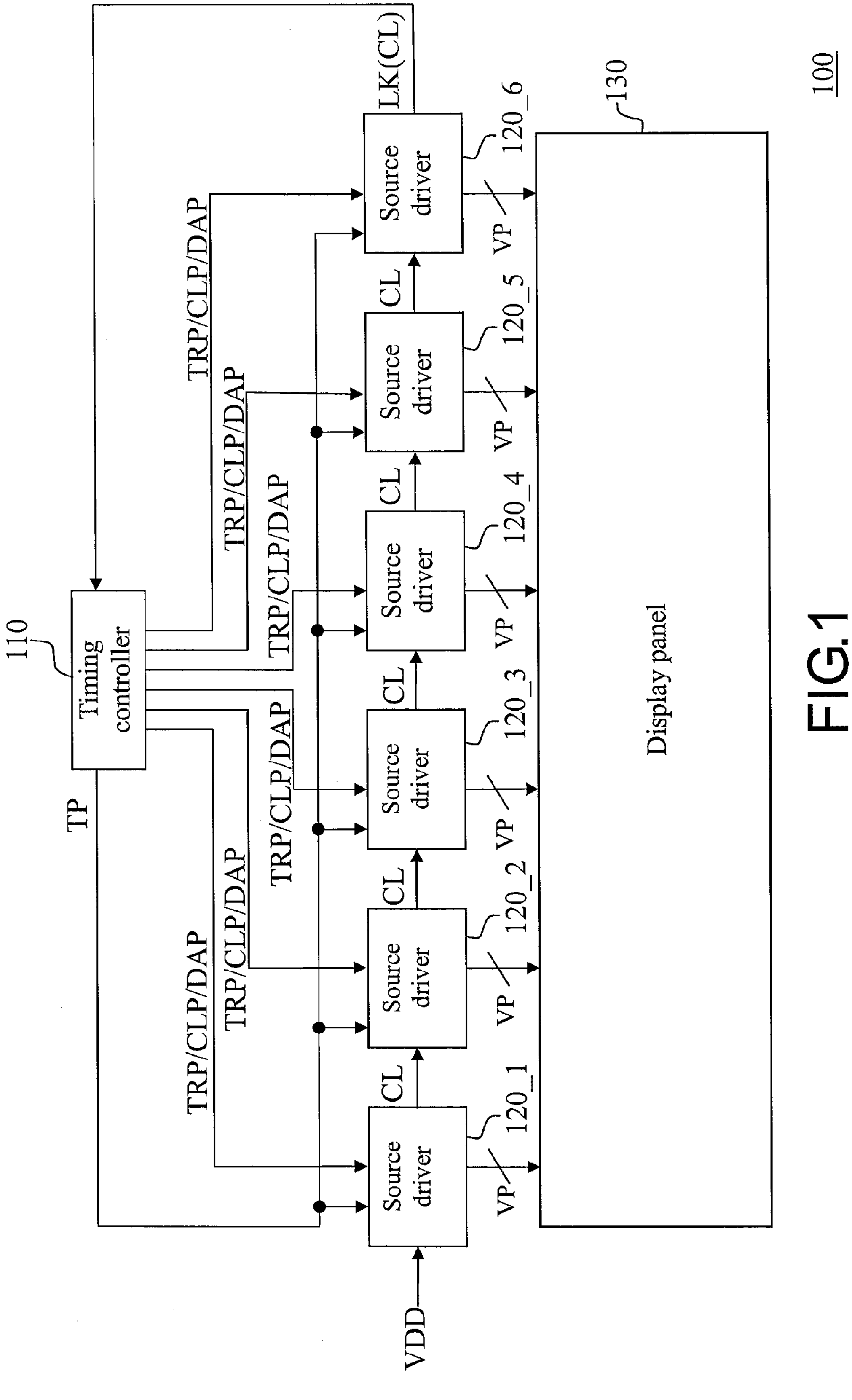
FIG. 1 is a schematic view illustrating a system of a display according to an embodiment of the invention.

FIG. 1 is a schematic view illustrating a system of a display according to an embodiment of the invention. With reference to FIG. 1, in this embodiment, the display 100 includes a timing controller 110, a plurality of source drivers, and a display panel 130. In FIG. 1, six source drivers 120_1~120_6 are exemplarily shown. The timing controller 110 is coupled to the source drivers 120_1~120_6, so as to output a plurality of training packets TRP, a plurality of control packets CLP, or a plurality of color data packets DAP to the source drivers 120_1~120_6. The source drivers 120_1~120_6 are coupled to the display panel 130 to respectively output a plurality of pixel voltages VP to the display panel 130.

In this embodiment, the training packets TRP, the control packets CLP, and the color data packets DAP are serially transmitted by a differential signal. Based on the circuit design of the timing controller 110 and the source drivers 120_1~120_6, the timing controller 110 may transmit the training packets TRP, the control packets CLP, and the color data packets DAP to the corresponding source drivers (e.g., the source drivers 120_1~120_6) via one set of differential signal lines or two sets of differential signal lines, which should not be construed as a limitation to the invention.

When the source drivers 120_1~120_6 receive the training packets TRP, the source drivers 120_1~120_6 respectively lock the timing of the training packets TRP to lock a clock of the timing controller 110 according to the training packets TRP received by the source drivers 120_1~120_6. Here, the source drivers 120_1~120_6 lock the clock of the timing controller 110 according to phase comparison. When each of the source drivers 120_1~120_6 respectively locks the clock of the timing controller 110, each of the source drivers 120_1~120_6 respectively outputs a clock lock signal CL. When the source drivers 120_1~120_6 all lock the clock of the timing controller 110, a lock signal LK is output to the timing controller 110.

In the present embodiment, the source drivers 120_1~120_6 sequentially lock the clock of the timing controller 110. To be more specific, the source driver 120_1 is triggered by a system voltage VDD to lock the clock of the timing controller 110. When the source driver 120_1 locks the clock of the timing controller 110, the source driver 120_1 outputs the clock lock signal CL to the source driver 120_2, so as to trigger the source driver 120_2 to lock the clock of the timing controller 110. When the source driver 120_2 locks the clock of the timing controller 110, the source driver 120_2 outputs the clock lock signal CL to the source driver 120_3, so as to trigger the source driver 120_3 to lock the clock of the timing controller 110. The rest may be deduced from the above and thus will not be reiterated herein. When the source driver 120_6 locks the clock of the timing controller 110, the source driver 120_6 outputs a clock lock signal CL (i.e., the lock signal LK) to the timing controller 110, so as to inform the timing controller 110 of the fact that the source drivers 120_1~120_6 all lock the clock of the timing controller 110.

When the timing controller 110 receives the lock signal LK, the timing controller 110 outputs the control packets CLP, the color data packets DAP, and a latch signal TP to the source drivers 120_1~120_6 according to the lock signal LK. The source drivers 120_1~120_6 respectively output the pixel voltages VP to the display panel 130 according to the latch signal TP and the color data packets DAP received by the source drivers 120_1~120_6.

Figure 2:
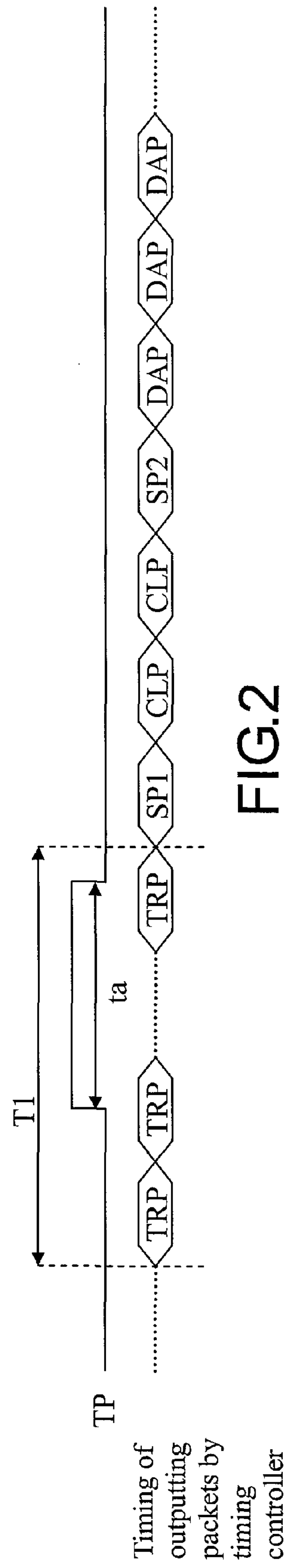
FIG. 2 is a schematic timing diagram of a display depicted in FIG. 1 according to an embodiment of the invention.

FIG. 2 is a schematic timing diagram of a display depicted in FIG. 1 according to an embodiment of the invention. With reference to FIG. 1 and FIG. 2, after the source drivers 120_1~120_6 lock the clock of the timing controller 110, the source drivers 120_1~120_6 may accurately receive the data packets (i.e., the control packets CLP and the color data packets DAP) transmitted by the timing controller 110. Hence, when the source drivers 120_1~120_6 do not lock the clock of the timing controller 110 (i.e., in the period T1), the timing controller 110 transmits the training packets TRP to the source drivers 120_1~120_6, such that the source drivers 120_1~120_6 may lock the clock of the timing controller 110 according to the training packets TRP.

Besides, the period T1 is determined according to the timing at which the source driver 120_6 outputs the lock signal LK. That is, the period T1 is determined according to the time frame required by all of the source drivers 120_1~120_6 for locking the clock of the timing controller 110. During the period T1, the latch signal TP is enabled, so as to trigger the source drivers 120_1~120_6 to re-position the voltages output by the source drivers 120_1~120_6. The time to of enabling the latch signal TP is longer than or equal to the time required for transmitting three training packets TRP. Here, the voltages output by the source drivers 120_1~120_6 may be re-positioned by sharing charges, which should however not be construed as a limitation to the invention.

After the source drivers 120_1~120_6 lock the clock of the timing controller 110, the timing controller 110 transmits a first start packets SP1 to the source drivers 120_1~120_6, so as to inform the source drivers 120_1~120_6 of starting the transmission of the control packets CLP. After the source drivers 120_1~120_6 receive the control packets CLP, the timing controller 110 transmits a second start packets SP2 to the source drivers 120_1~120_6, so as to inform the source drivers 120_1~120_6 of starting the transmission of the color data packets DAP. The timing controller 110 then outputs the control packets CLP to the source drivers 120_1~120_6, so as to determine the operational mode or the parameters of the source drivers 120_1~120_6. Alternatively, the source drivers 120_1~120_6 output the color data packets DAP to the source drivers 120_1~120_6, and the source drivers 120_1~120_6 output the pixel voltages VP according to the color data packets DAP received by the source drivers 120_1~120_6.

After the source drivers 120_1~120_6 receive sufficient color data packets DAP, the timing controller 110 enables the latch signal TP, such that the timing controller 110 may determine the timings at which the source drivers 120_1~120_6 output the pixel voltages VP. Thereby, the source drivers 120_1~120_6 and the timing controller 110 may be synchronously operated in no need of clock signals, and the number of the pins in the source drivers 120_1~120_6 and the timing controller 110 may be reduced. As such, the hardware costs of the source drivers 120_1~120_6 and the timing controller 110 may be lowered down.

Figure 3:
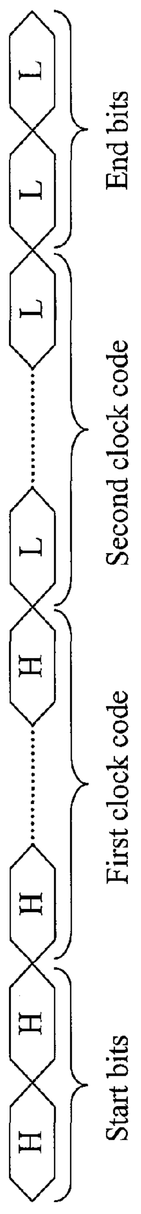
FIG. 3 is a schematic view illustrating the training packets depicted in FIG. 2 according to an embodiment of the invention.

FIG. 3 is a schematic view illustrating the training packets depicted in FIG. 2 according to an embodiment of the invention. With reference to FIG. 3, in this embodiment, each of the training packets TRP includes two start bits, two end bits, a first clock code, and a second clock code. The bit number of the first clock code is equal to the bit number of the second clock code. The first clock code is located between the start bits and the second clock code, and the second clock code is located between the first clock code and the end bits. Here, the start bits and the bits of the first clock code respectively correspond to a logic high level H, and the end bits and the bits of the second clock code respectively correspond to a logic low level L, such that the training packets TRP are logically equal to a pulse of the clock signal.

Figure 4:
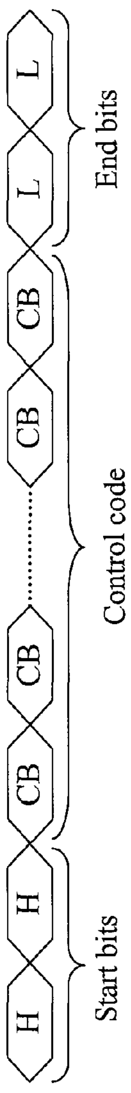
FIG. 4 is a schematic view illustrating the control packets depicted in FIG. 2 according to an embodiment of the invention.

FIG. 4 is a schematic view illustrating the control packets depicted in FIG. 2 according to an embodiment of the invention. With reference to FIG. 4, in this embodiment, each of the control packets CLP includes two start bits, two end bits, and a control code located between the start bits and the end bits. The control code is constituted by a plurality of control data bits CB. Besides, the start bits respectively correspond to a logic high level H, and the end bits respectively correspond to a logic low level L.

Figure 5:
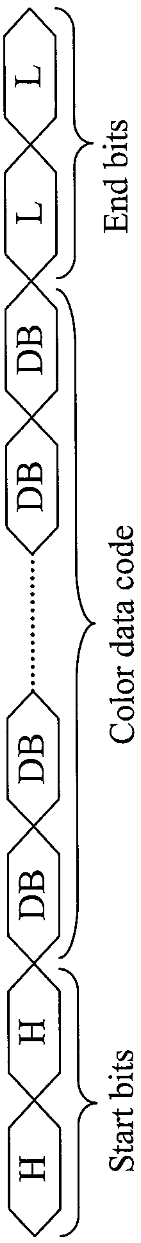
FIG. 5 is a schematic view illustrating the color data packets depicted in FIG. 2 according to an embodiment of the invention.

FIG. 5 is a schematic view illustrating the color data packets depicted in FIG. 2 according to an embodiment of the invention. With reference to FIG. 5, in the present embodiment of the invention, each of the color data packets DAP includes two start bits, two end bits, and a color data code located between the start bits and the end bits. The color data code is constituted by a plurality of color data bits DB. The start bits respectively correspond to the logic high level H, and the end bits respectively correspond to the logic low level L.

In this embodiment, the color data code may correspond to two of red color data, green color data, and blue color data, or the color data code may correspond to one of red color data, green color data, and blue color data. People having ordinary skill in the art may make modifications accordingly.

Additionally, in this embodiment, the packet size of the training packets TRP, the packet size of the control packets CLP, and the packet size of the color data packets DAP are the same (i.e., the bit number of these packets is the same). If each of the color data is assumed to be 10 bits, and the color data code corresponds to two of the red color data, the green color data, and the blue color data, the training packets TRP, the control packets CLP, and the color data packets DAP are 24 bits (i.e., 2+10+10+2). If each of the color data is assumed to be 10 bits, and the color data code corresponds to one of the red color data, the green color data, and the blue color data, the training packets TRP, the control packets CLP, and the color data packets DAP are 14 bits (i.e., 2+10+2).

If each of the color data is assumed to be 8 bits, and the color data code corresponds to two of the red color data, the green color data, and the blue color data, the training packets TRP, the control packets CLP, and the color data packets DAP are 20 bits (i.e., 2+8+8+2). If each of the color data is assumed to be 8 bits, and the color data code corresponds to one of the red color data, the green color data, and the blue color data, the training packets TRP, the control packets CLP, and the color data packets DAP are 12 bits (i.e., 2+8+2).

If each of the color data is assumed to be 6 bits, and the color data code corresponds to two of the red color data, the green color data, and the blue color data, the training packets TRP, the control packets CLP, and the color data packets DAP are 16 bits (i.e. 2+6+6+2). If each of the color data is assumed to be 6 bits, and the color data code corresponds to one of the red color data, the green color data, and the blue color data, the training packets TRP, the control packets CLP, and the color data packets DAP are 10 bits (i.e. 2+6+2).

Figure 6:
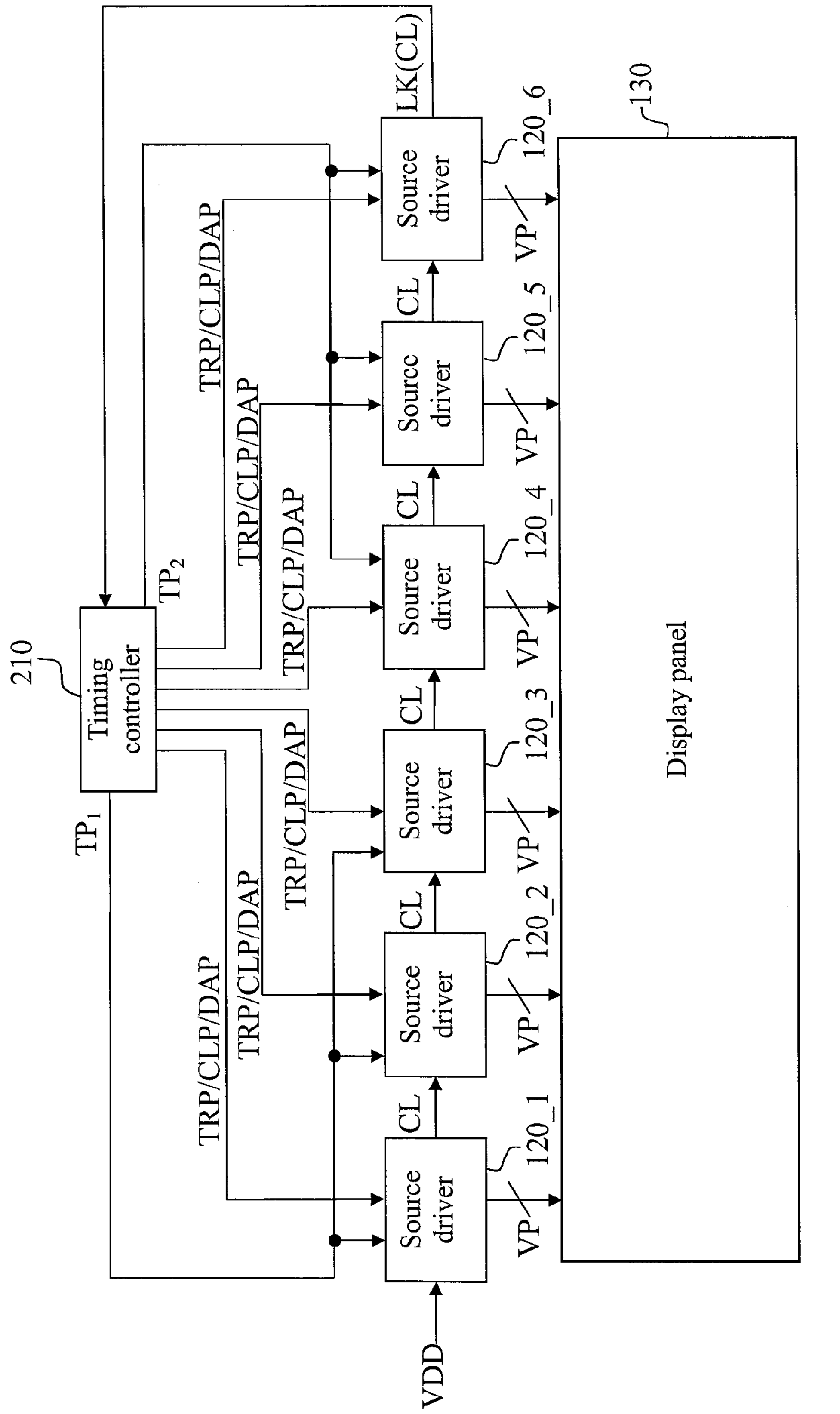
FIG. 6 is a schematic view illustrating a system of a display according to another embodiment of the invention.

FIG. 6 is a schematic view illustrating a system of a display according to another embodiment of the invention. With reference to FIG. 1 and FIG. 6, the display 200 of this embodiment is similar to the display 100 depicted in FIG. 1, while the difference therebetween lies in that the timing controller 210 outputs two latch signals $TP_1$ and $TP_2$. The source drivers 120_1~120_3 are controlled by the latch signal $TP_1$ and output the pixel voltages VP, and the source drivers 120_1~4~120_6 are controlled by the latch signal $TP_2$ and output the pixel voltages VP. In other words, the source drivers 120_1~120_6 are respectively controlled by the latch signals $TP_1$ and $TP_2$ and output the pixel voltages VP. Similarly, when the timing controller 210 outputs a plurality of latch signals, the source drivers (e.g., the source drivers 120_1~120_6) are respectively controlled by the corresponding latch signals and output the pixel voltages VP.

Figure 7:
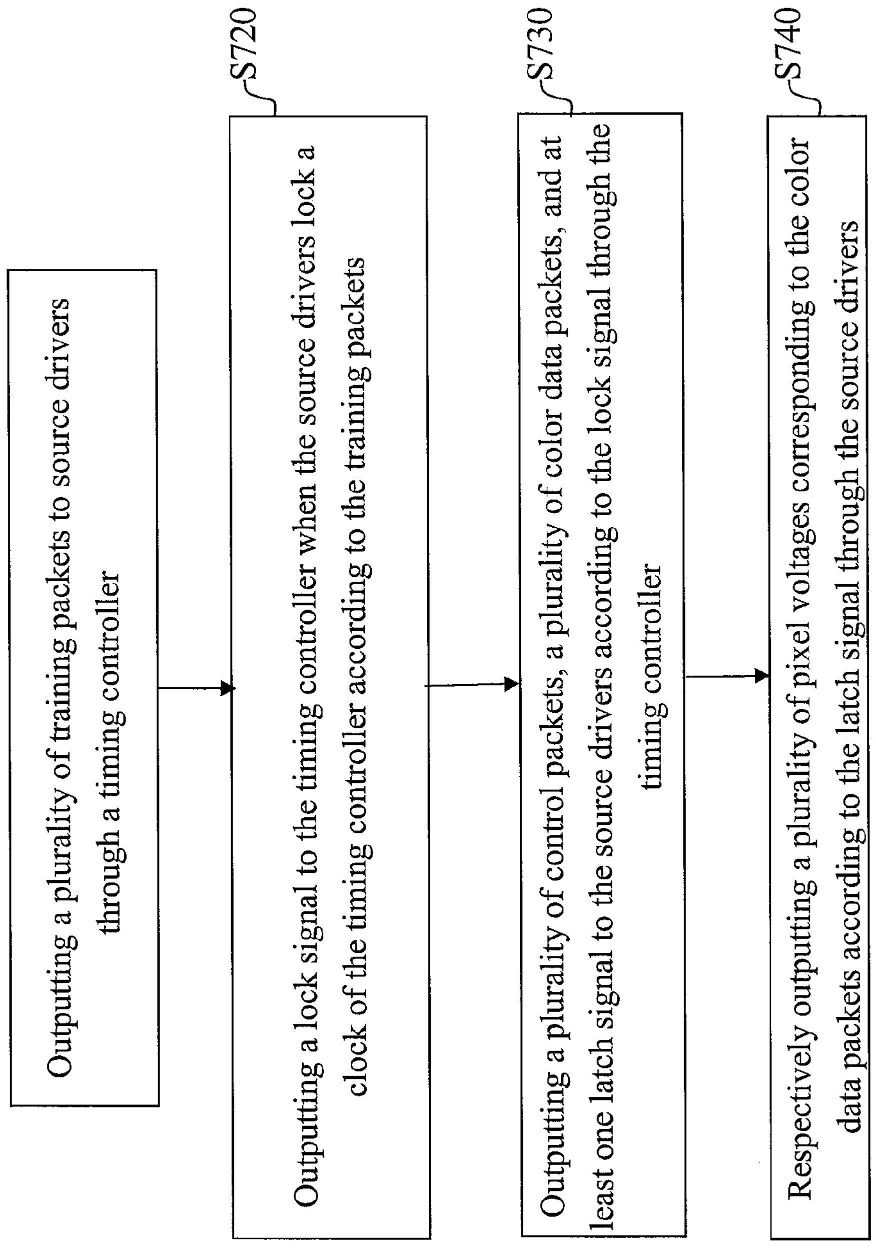
FIG. 7 is a flowchart illustrating an operating method of a display according to an embodiment of the invention.

FIG. 7 is a flowchart illustrating an operating method of a display according to an embodiment of the invention. With reference to FIG. 7, the display of this embodiment includes a timing controller and a plurality of source drivers. The timing controller outputs a plurality of training packets to the source drivers (step S710). When the source drivers lock a clock of the timing controller according to the training packets, a lock signal is output to the timing controller (step S720). The timing controller outputs a plurality of control packets, a plurality of color data packets, and at least one latch signal to the source drivers according to the lock signal (step S730). Here, the training packets and the color data packets are serially transmitted to the source drivers. The source drivers respectively output a plurality of pixel voltages corresponding to the color data packets according to the latch signals (step S740). The above-mentioned order of performing said steps is exemplary and should not be construed as a limitation to the invention. The detailed steps may be referred to as those described above with respect to the displays 100 and 200 and thus are not reiterated herein.

Figure 8:
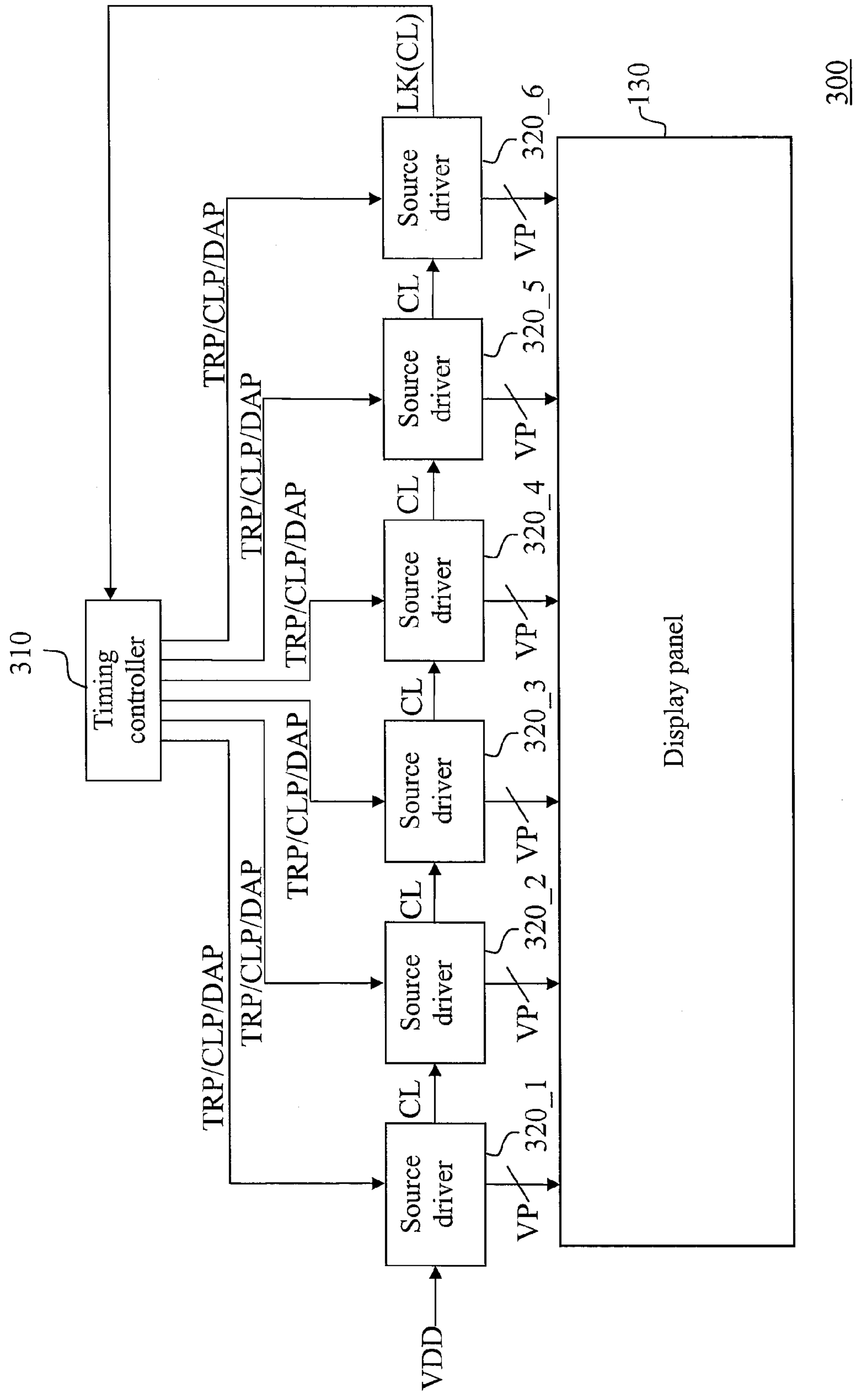
FIG. 8 is a schematic view illustrating a system of a display according to another embodiment of the invention.

FIG. 8 is a schematic view illustrating a system of a display according to another embodiment of the invention. With reference to FIG. 1 and FIG. 8, the display 300 of this embodiment is similar to the display 100 depicted in FIG. 1, while the difference therebetween lies in the timing controller 310 and the source drivers 320_1~320_6. Similar to the source drivers 120_1~120_6, when the source drivers 320_1~320_6 lock a clock of the timing controller 310 according to the training packets TRP, the source driver 320_6 outputs a clock lock signal CL (i.e., the lock signal LK) to the timing controller 310 to inform the timing controller 310 of the fact that the source drivers 320_1~320_6 all lock the clock of the timing controller 310. When the timing controller 310 receives the lock signal LK, the timing controller 310 outputs the control packets CLP and the clock data packets DAP to the source drivers 320_1~320_6 according to the lock signal LK.

In the present embodiment, the source drivers 320_1~320_6 respectively output the pixel voltages VP to the display panel 130 according to the color data packets DAP received by the source drivers 320_1~320_6. Besides, the source drivers 320_1~320_6 configure the operational mode or the parameters of the source drivers 320_1~320_6 according to the control packets CLP received by the source drivers 320_1~320_6. Hence, the timing controller 310 may determine the timings at which the source drivers 320_1~320_6 output the pixel voltages VP through the control packets CLP. The operation of the source drivers 320_1~320_6 is based on the clock of the timing controller 310; therefore, the source drivers 320_1~320_6 determine the output timings of the pixel voltages VP according to the clock of the timing controller 310 and the control packets CLP received by the source drivers 320_1~320_6.

Figure 9:
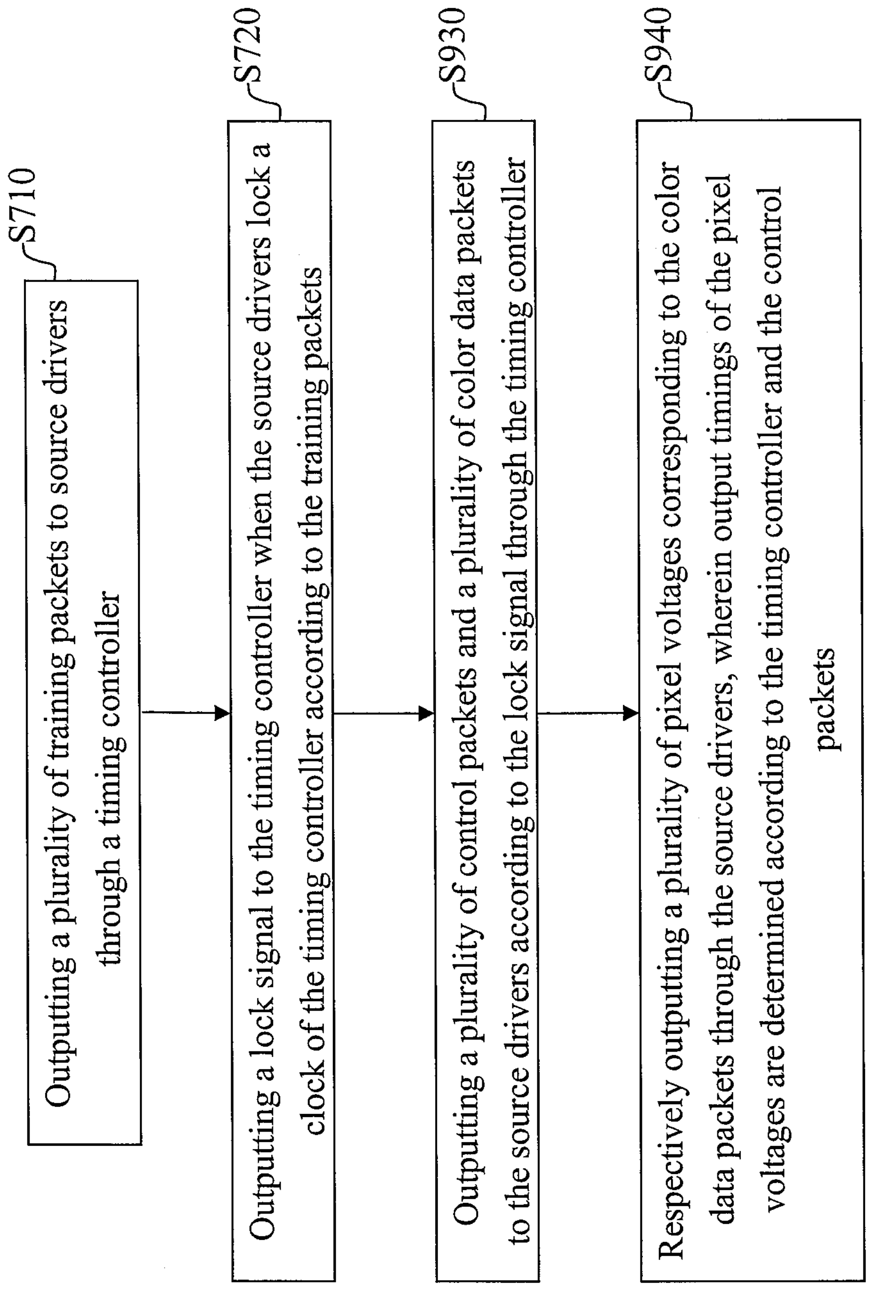
FIG. 9 is a flowchart illustrating an operating method of a display according to another embodiment of the invention.

FIG. 9 is a flowchart illustrating an operating method of a display according to another embodiment of the invention. With reference to FIG. 7 and FIG. 9, the differences therebetween rest in steps S930 and S940. In the step S930, the timing controller outputs a plurality of control packets and a plurality of color data packets to the source drivers according to the lock signal. Here, the training packets and the color data packets are serially transmitted to the source drivers. In the step S940, the source drivers respectively output a plurality of pixel voltages corresponding to the color data packets, and the output timings of the pixel voltages are determined according to the clock of the timing controller and the control packets. The above-mentioned order of performing said steps is exemplary and should not be construed as a limitation to the invention. The detailed steps may be referred to as those described above with respect to the displays 100 to 300 and thus are not reiterated herein.

To sum up, in the display and the operating method thereof described in the embodiments of the invention, operations of the timing controller and the source drivers may be synchronized due to the training packets, and the timings at which the source drivers output the pixel voltages are configured through the control packets. Hence, the timing controller and the source drivers are synchronously operated in no need of the clock signals and the latch signals, and the hardware costs of the timing controller and the source drivers may be lowered down.

It will be apparent to those skilled in the art that various modifications and variations can be made to the structure of the disclosed embodiments without departing from the scope or spirit of the disclosure. In view of the foregoing, it is intended that the disclosure covers modifications and variations of this disclosure provided they fall within the scope of the following claims and their equivalents.

What is claimed is:

1. A display comprising:

a display panel;

a timing controller; and a plurality of source drivers coupled to the timing controller and the display panel, the source drivers being coupled to one another, wherein the timing controller outputs a plurality of training packets to the source drivers, when the source drivers lock a clock of the timing controller according to the training packets, a lock signal is output to the timing controller, the timing controller outputs a plurality of color data packets and a plurality of control packets to the source drivers according to the lock signal, the source drivers respectively output a plurality of pixel voltages corresponding to the color data packets to the display panel and determine output timings of the pixel voltages according to the clock of the timing controller and the control packets, and the training packets and the color data packets are serially transmitted to the source drivers, and the source drivers sequentially locking the clock of the timing controller, wherein when an $i^{th}$ source driver of the source drivers locks the clock of the timing controller, the $i^{th}$ source driver outputs a clock lock signal to an $(i+1)^{th}$ source driver of the source drivers, so as to trigger the $(i+1)^{th}$ source driver to lock the clock of the timing controller, and when a last source driver of the source drivers locks the clock of the timing controller, the last source driver outputs the lock signal to the timing controller, and a first source driver of the source drivers is triggered by a system voltage to lock the clock of the timing controller, i being greater than or equal to 1 and smaller than the number of the source drivers, wherein the training packets, a first start packet, the control packets, a second start packet and the color data packets are outputted to the source drivers in order via one set of differential signal lines which consists of two signal lines, the first start packet informs the starting transmission of the control packets, the second start packet informs the starting transmission of the color data packets, the control packets set an operational mode or parameters of the source drives, and the color data packets set pixel voltages provided by the source drivers, wherein each of the control packets comprises two start bits, two end bits, and a color data code located between the start bits and the end bits, the control packets only transmit between the first start packet and the second start packet, and the color data packets only transmit after the second start packet.

2. The display as recited in claim 1, wherein each of the control packets comprises two start bits, two end bits, and a control code located between the start bits and the end bits.

3. The display as recited in claim 2, wherein the start bits respectively correspond to a logic high level, and the end bits respectively correspond to a logic low level.

4. The display as recited in claim 1, wherein the training packets, the color data packets, and the control packets are respectively transmitted by a differential signal.

5. The display as recited in claim 1, wherein the color data code corresponds to two of red color data, green color data, and blue color data.

6. The display as recited in claim 1, wherein the color data code corresponds to one of red color data, green color data, and blue color data.

7. The display as recited in claim 1, wherein the start bits respectively correspond to a logic high level, and the end bits respectively correspond to a logic low level.

8. The display as recited in claim 1, wherein each of the training packets comprises two start bits, two end bits, a first clock code, and a second clock code, the first clock code is located between the start bits and the second clock code, and the second clock code is located between the first clock code and the end bits.

9. The display as recited in claim 8, wherein the start bits and a plurality of bits of the first clock code respectively correspond to a logic high level, and the end bits and a plurality of bits of the second clock code respectively correspond to a logic low level.

10. The display as recited in claim 1, wherein the source drivers lock the clock of the timing controller according to phase comparison.

11. An operating method of a display, the display comprising a timing controller and a plurality of source drivers, the operating method comprising:

outputting a plurality of training packets to the source drivers through the timing controller;

outputting a lock signal to the timing controller when the source drivers lock a clock of the timing controller according to the training packets;

outputting a plurality of color data packets and a plurality of control packets to the source drivers according to the lock signal through the timing controller; and respectively outputting a plurality of pixel voltages corresponding to the color data packets through the source drivers, output timings of the pixel voltages being determined according to the clock of the timing controller and the control packets, wherein the training packets and the color data packets are serially transmitted to the source drivers, and the source drivers sequentially lock the clock of the timing controller, wherein when an $i^{th}$ source driver of the source drivers locks the clock of the timing controller, the $i^{th}$ source driver outputs a clock lock signal to an $(i+1)^{th}$ source driver of the source drivers, so as to trigger the $(i+1)^{th}$ source driver to lock the clock of the timing controller, and when a last source driver of the source drivers locks the clock of the timing controller, the last source driver outputs the lock signal to the timing controller, and a first source driver of the source drivers is triggered by a system voltage to lock the clock of the timing controller, i being greater than or equal to 1 and smaller than the number of the source drivers, wherein the training packets, a first start packet, the control packets, a second start packet and the color data packets are outputted to the source drivers in order via one set of differential signal lines which consists of two signal lines, the first start packet informs the starting transmission of the control packets, the second start packet informs the starting transmission of the color data packets, the control packets set an operational mode or parameters of the source drivers, and the color data packets set pixel voltage provided by the source drivers, wherein each of the control packets comprises two start bits, two end bits, and a color data code located between the start bits and the end bits, the control packets only transmit between the first start packet and the second start packet, and the color data packets only transmit after the second start packet.

12. The operating method of the display as recited in claim 11, wherein the source drivers lock the clock of the timing controller according to phase comparison.

* * * * *